United States Patent
Shotey et al.

(10) Patent No.: US 9,634,440 B2
(45) Date of Patent: Apr. 25, 2017

(54) GFCI WITH CYCLE COUNTER

(71) Applicant: Hubbell Incorporated, Shelton, CT (US)

(72) Inventors: Marcus J. Shotey, Scottsdale, AZ (US); Jeffrey P. Baldwin, Phoenix, AZ (US)

(73) Assignee: Hubbell Incorporated, Shelton, CT (US)

( * ) Notice: Subject to any disclaimer, the term of this patent is extended or adjusted under 35 U.S.C. 154(b) by 0 days.

(21) Appl. No.: 15/054,997

(22) Filed: Feb. 26, 2016

(65) Prior Publication Data

US 2016/0181739 A1    Jun. 23, 2016

Related U.S. Application Data

(63) Continuation of application No. 14/077,939, filed on Nov. 12, 2013, now abandoned.

(60) Provisional application No. 61/725,303, filed on Nov. 12, 2012.

(51) Int. Cl.

| G08B 21/00 | (2006.01) |
| G01R 31/02 | (2006.01) |
| G01R 31/327 | (2006.01) |
| H01H 77/00 | (2006.01) |
| H01H 83/00 | (2006.01) |
| H01H 47/00 | (2006.01) |
| H01H 50/12 | (2006.01) |
| H01R 13/66 | (2006.01) |
| H01H 83/04 | (2006.01) |
| G08B 21/18 | (2006.01) |
| H02H 3/16 | (2006.01) |
| G01R 31/04 | (2006.01) |

(52) U.S. Cl.
CPC ....... *H01R 13/6691* (2013.01); *G08B 21/185* (2013.01); *H01H 83/04* (2013.01); *H01R 13/6683* (2013.01); *H02H 3/16* (2013.01); *G01R 31/045* (2013.01); *G01R 31/3277* (2013.01)

(58) Field of Classification Search
CPC .. H02H 9/042; G01R 31/045; G01R 31/3277; H01H 83/04
USPC ........ 340/650, 638, 635, 652, 653; 324/424; 335/17; 361/142
See application file for complete search history.

(56) References Cited

U.S. PATENT DOCUMENTS

| 4,833,455 A | 5/1989 | Bishop |
| 8,830,015 B2 | 9/2014 | Padro et al. |
| 2002/0149502 A1 | 10/2002 | Goss |
| 2006/0238933 A1 | 10/2006 | Huang et al. |
| 2007/0035898 A1 | 2/2007 | Baldwin et al. |
| 2008/0007879 A1 | 1/2008 | Zaretsky et al. |
| 2008/0174329 A1 | 7/2008 | Papageorgiou et al. |
| 2011/0221600 A1* | 9/2011 | Kinsel ................... H02H 3/335 340/650 |
| 2013/0278395 A1 | 10/2013 | Johnson et al. |

* cited by examiner

*Primary Examiner* — Emily C Terrell
(74) *Attorney, Agent, or Firm* — Michael Best & Friedrich, LLP

(57) ABSTRACT

Systems and methods for providing end-of-life functionality in an electrical component using a count of plugging operations are shown. In some configurations, a GFCI counts plugging operations and then provides an LED end-of-life indication when a threshold of plugging operations is met.

28 Claims, 1 Drawing Sheet

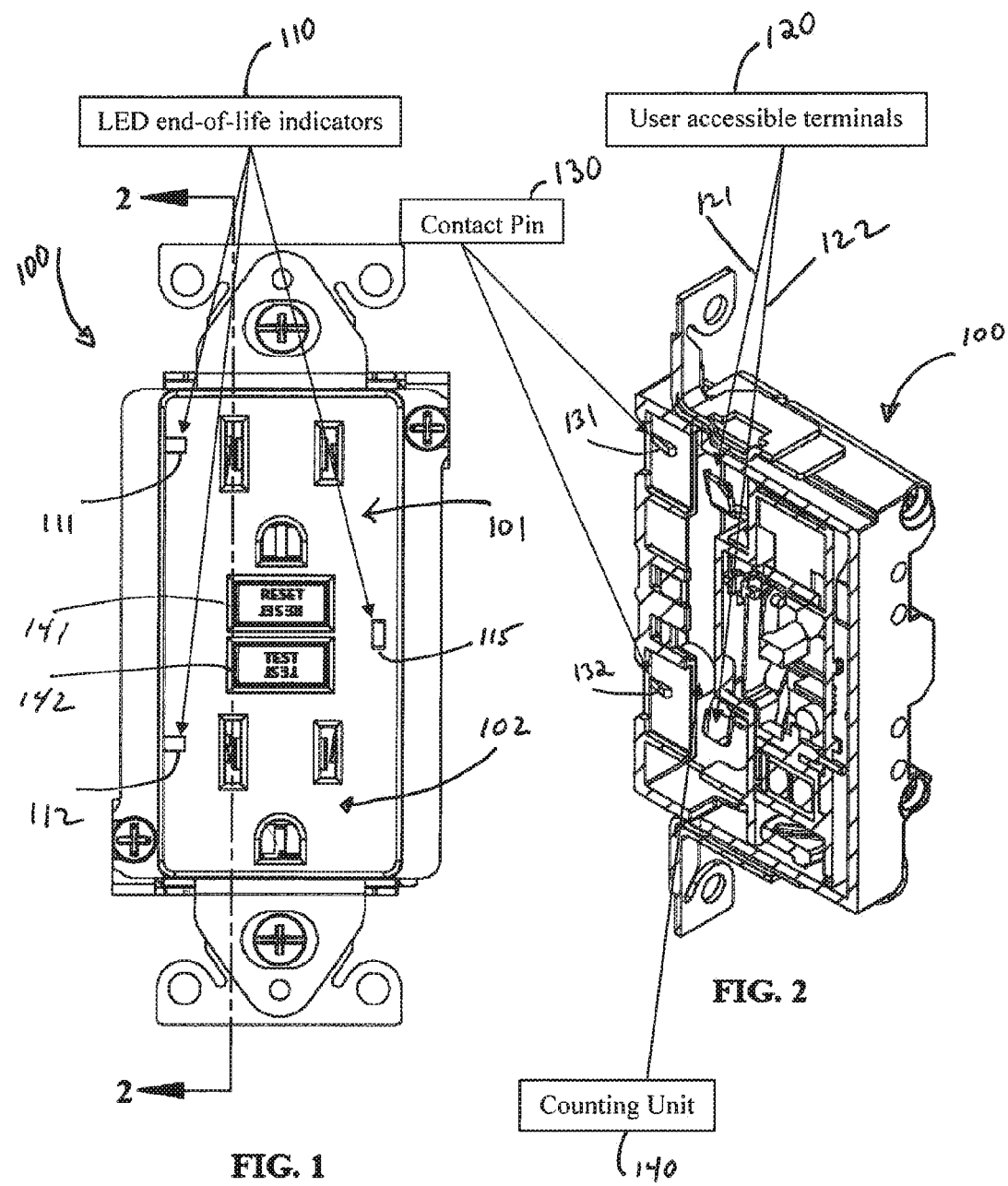

GFCI WITH CYCLE COUNTER

CROSS REFERENCE TO RELATED APPLICATIONS

This application is a continuation of prior-filed, co-pending U.S. patent application Ser. No. 14/077,939, filed Nov. 12, 2013, which claims the benefit of U.S. Provisional Patent Application No. 61/725,303, entitled GFCI WITH CYCLE COUNTER by Shotey, et al., filed Nov. 12, 2012. The contents of all of these documents are hereby incorporated by reference in their entirety.

FIELD OF THE INVENTION

The illustrative embodiments described in the present application are useful in systems including those for circuit interrupter capability and more particularly are useful in systems including those for end-of-life capability in a circuit interrupter.

BACKGROUND

Buildings including commercial and residential buildings often use common electrical components such as electrical outlets and ground fault circuit interrupter (GFCI) outlets for connecting to a 120 v, 240 v or similar wiring in a building. Circuit interrupters are in common use and required by various building electrical codes. Accordingly, GFCI devices with certain end-of-life (EOL) functionality have been described. For example, U.S. Pat. No. 8,159,794, issued to Baldwin, et al., Apr. 17, 2012 and describes self testing ground fault circuit interrupters (GFCI) with end of life (EOL) detection that reject false EOL information, such patent incorporated by reference herein in its entirety.

However, end-of-life conditions may occur due to other conditions. Accordingly, there is a need, among other needs, for additional end-of-life capability in electrical components including circuit interrupters.

SUMMARY

The present application describes illustrative embodiments of systems and methods for providing end-of-life functionality in an electrical component using a count of plugging operations (or including unplugging operations, both or a representative parameter therefore). In certain illustrative embodiments, the systems and methods are useful in systems including those for providing end-of-life functionality in a GFCI.

In one illustrative example, an electrical component has at least one receptacle for receiving an electrical plug. The electrical component also has a mechanism for counting plugging operations into the receptacle. The electrical component has a mechanism for indicating an end-of-life condition.

In another illustrative embodiment, the electrical component includes a GFCI receptacle. The GFCI includes a counting mechanism for counting plugging operations in the GFCI. In some illustrative embodiments, a counting unit is utilized. Alternatively, a GFCI processor may be used to count plugging operations.

In yet another illustrative embodiment, the electrical component includes a GFCI receptacle having a first electrical receptacle for receiving a first electrical plug and a second electrical receptacle for receiving a second plug. The GFCI receptacle has a first EOL indicator associated with the first electrical receptacle, a second EOL indicator associated with the second electrical receptacle. The counting mechanism may separately count plugging operations for each of the electrical receptacles. Additionally, the GFCI may optionally have a third EOL indicator associated with the entire GFCI receptacle.

BRIEF DESCRIPTION OF THE DRAWINGS

The accompanying drawings illustrate presently preferred embodiments of the invention, and together with the general description given above and the detailed description given below, serve to explain the principles of the invention. As shown throughout the drawings, like reference numerals designate like or corresponding parts.

FIG. 1 is a plan view of a representative electrical component system including a representative first electrical receptacle and a second representative receptacle according to an illustrative embodiment of the present application.

FIG. 2 is a perspective view of a cutaway of the electrical component system of FIG. 1.

DETAILED DESCRIPTION

The illustrative embodiments of the present application describe systems and methods for providing end-of-life functionality in an electrical component using a count of plugging operations (or unplugging operations, both or a representative parameter therefore). In certain illustrative embodiments, the systems and methods are useful in systems including those for providing end-of-life functionality in a circuit interrupter such as a GFCI.

In one illustrative example, an electrical component has at least one receptacle for receiving an electrical plug such as a 120 v/20A plug with wiring attached. The electrical component also has a mechanism for counting plugging operations into the receptacle such as a contact pin switch that is activated upon the plugging in of the plug into the electrical receptacle. The electrical component has a mechanism for indicating an end-of-life condition such as one or more warning light emitting diodes (LEDs).

In another illustrative embodiment, the electrical component includes a circuit interrupter such as a GFCI receptacle. The GFCI includes a processor with memory for storing logic instructions and with memory for scratch pad and other storage such as counting register storage. The GFCI includes a counting mechanism for counting plugging operations in the GFCI. In some illustrative embodiments, a counting unit is utilized. Alternatively, a GFCI processor may be used to count plugging operations.

In yet another illustrative embodiment, the electrical component includes a GFCI receptacle having a first electrical receptacle for receiving a first electrical plug and a second electrical receptacle for receiving a second plug. The GFCI receptacle has a first EOL indicator associated with the first electrical receptacle, a second EOL indicator associated with the second electrical receptacle. The counting mechanism may separately count plugging operations for each of the electrical receptacles. Additionally, the GFCI may optionally have a third EOL indicator associated with the entire GFCI receptacle.

In certain illustrative embodiments, the systems and methods are useful in systems including those for providing circuit interrupter capability and more particularly are useful in systems including those for end-of-life capability in a circuit interrupter.

Referring to FIG. 1, a plan view of an electrical component system 100 including a representative first electrical receptacle 101 and a second representative receptacle 102 according to an illustrative embodiment of the present application is shown. The electrical component system in the illustrative embodiment is a GFCI. There are also three end-of-life indicators (110) that are LEDs in the face of the GFCI in this illustrative embodiment. Here, first LED indicator 111 is in the vicinity of the first electrical receptacle 101, second LED indicator 112 is in the vicinity of the second electrical receptacle 102 and third LED indicator 115 is in the vicinity of the control buttons (141, 142) for the GFCI.

Referring to FIG. 2, a perspective view of a cutaway of the electrical component system 100 of FIG. 1 is shown. Here, the cutaway shows contact pin switches 130. In this configuration, there is one contact pin for each electrical receptacle, respectively. Here, contact pin 131 corresponds to first electrical receptacle 101 and second contact pin 132 corresponds to second electrical receptacle 102. Similarly, the user accessible terminals 120 correspond to the electrical receptacles. Here, the electrical receptacles are typical 120v/15A single phase plugs with three terminals having hot/neutral/ground. User accessible terminal 121 is used in counting plugging operations for electrical receptacle 101 and user accessible terminal 122 is used in counting plugging operations for electrical receptacle 102.

Certain Ground Fault Circuit Interrupters (GFCIs) are required to have an end of life monitoring system. The end-of-life monitoring system may prevent the user from accessing active terminals by shutting off current flow through the device or by providing a user perceivable event. Either of these or other end-of-life actions may be taken herein. These events may include turning on or off a light or providing an audible tone.

A common reason a GFCI (100) reaches its end-of-life condition is due to significant wearing at the user accessible terminals from continuous and regular plugging and unplugging of electrical device plugs. The illustrative embodiments of the present application provide representative GFCIs with LED end-of-life warning lights near each of the receptacle terminals and/or a centrally located LED. Alternatively, the electrical component system may cut off current or provide another additional or alternative user perceivable event than LED indication.

Advantageously, the device may be arranged to warn the user that only one of the set of terminals (101, 102) has reached its end-of-life, but the other terminal, respectively is free to be used, such as by using LEDs (111, 112). Alternatively, a single LED (115) may be illuminated and warn the user that the entire device must be replaced.

The GFCI (100) may include a contact pin (130) between the terminal opening and the terminal contacts which is activated each time an electrical prong is inserted through the opening. A contact pin (131, 132) may be provided for each respective electrical receptacle (101, 102). A counting unit (140) may also be incorporated to illuminate the LED once a predetermined threshold of insertions has been reached. In the alternative, the GFCI circuit board may include processing logic in a processor having memory (not shown) for counting the number of insertions prior to activating the end-of-life LED.

In still another alternative implementation, the contact pins are operated by the user inserting a plug, which in turn flexes the GFCI terminals and operates a contact pin. The remainder of the operation remains consistent.

While illustrative embodiments of the invention have been described and illustrated above, it should be understood that these are exemplary of the invention and are not to be considered as limiting. Additions, deletions, substitutions, and other modifications can be made without departing from the spirit or scope of the present invention. Accordingly, the invention is not to be considered as limited by the foregoing description.

We claim:

1. An electrical component comprising:
   a first electrical receptacle; and
   a first counting mechanism operatively coupled to the first electrical receptacle for counting plugging operations into the first receptacle, the first counting mechanism including a contact pin switch that is activated upon the plugging in of a plug into the electrical receptacle.

2. The electrical component of claim 1, wherein, the first counting mechanism includes a contact pin switch that is activated by the flexing of a first terminal of the first electrical receptacle.

3. The electrical component of claim 1, further comprising: memory for counting the number of plugging operations.

4. The electrical component of claim 1, further comprising a first end-of-life indicator for providing end-of-life functionality when a threshold of first plugging operations has been met.

5. The electrical component of claim 4, wherein the first end-of-life indicator includes a mechanism for shutting current flow to the first receptacle.

6. The electrical component of claim 4, wherein the first end-of-life indicator includes a mechanism for emitting an audible tone.

7. The electrical component of claim 4, further comprising a second end-of-life indicator for providing end-of-life functionality when a threshold of second plugging operations has been met.

8. The electrical component of claim 7, wherein the second end-of-life indicator includes a mechanism for shutting current flow to the first receptacle.

9. The electrical component of claim 7, wherein the second end-of-life indicator includes a mechanism for emitting an audible tone.

10. The electrical component of claim 7, further comprising a third end-of-life indicator for providing end-of-life functionality when a threshold of first plugging operations or second plugging operations has been met.

11. The electrical component of claim 1, wherein the first counting mechanism comprises a first contact pin operatively connected to the first electrical receptacle.

12. The electrical component of claim 11, further comprising a processor operatively connected to the first counting mechanism.

13. The electrical component of claim 1, further comprising:
   a second electrical receptacle;
   a second counting mechanism operatively coupled to the second electrical receptacle for counting plugging operations into the second receptacle, the second counting mechanism including a contact pin switch that is activated upon the plugging in of a plug into the second electrical receptacle.

14. The electrical component of claim 13, wherein at least one of the first counting mechanism and the second counting mechanism includes a contact pin operatively connected to one of the first electrical receptacle and the second electrical receptacle, and further comprising a processor operatively connected to the first counting mechanism and the second counting mechanism.

15. An electrical component comprising:
   a first electrical receptacle; and
   a first counting mechanism operatively coupled to the first electrical receptacle for counting plugging operations into the first receptacle, the first counting mechanism including a contact pin switch that is activated by the flexing of a first terminal of the first electrical receptacle.

16. The electrical component of claim 15, wherein the first counting mechanism includes a contact pin switch that is activated upon the plugging in of a plug into the electrical receptacle.

17. The electrical component of claim 15, further comprising memory for counting the number of plugging operations.

18. The electrical component of claim 15, further comprising a first end-of-life indicator for providing end-of-life functionality when a threshold of first plugging operations has been met.

19. The electrical component of claim 18, wherein the first end-of-life indicator includes a mechanism for shutting current flow to the first receptacle.

20. The electrical component of claim 18, wherein the first end-of-life indicator includes a mechanism for emitting an audible tone.

21. The electrical component of claim 18, further comprising a second end-of-life indicator for providing end-of-life functionality when a threshold of second plugging operations has been met.

22. The electrical component of claim 21, wherein the second end-of-life indicator includes a mechanism for shutting current flow to the first receptacle.

23. The electrical component of claim 21, wherein the second end-of-life indicator includes a mechanism for emitting an audible tone.

24. The electrical component of claim 21, further comprising a third end-of-life indicator for providing end-of-life functionality when a threshold of first plugging operations or second plugging operations has been met.

25. The electrical component of claim 15, wherein the first counting mechanism comprises a first contact pin operatively connected to the first electrical receptacle.

26. The electrical component of claim 25, further comprising a processor operatively connected to the first counting mechanism.

27. The electrical component of claim 15, further comprising:
   a second electrical receptacle;
   a second counting mechanism operatively coupled to the second electrical receptacle for counting plugging operations into the second receptacle, the second counting mechanism including a contact pin switch that is activated upon the plugging in of a plug into the second electrical receptacle.

28. The electrical component of claim 27, wherein at least one of the first counting mechanism and the second counting mechanism includes a contact pin operatively connected to one of the first electrical receptacle and the second electrical receptacle, and further comprising a processor operatively connected to the first counting mechanism and the second counting mechanism.

* * * * *